United States Patent [19]

Sasaki

[11] Patent Number: 4,924,192
[45] Date of Patent: May 8, 1990

[54] ADJUSTING APPARATUS FOR ADJUSTING SOUND VOLUME OR SOUND QUALITY

[75] Inventor: Yoshio Sasaki, Saitama, Japan

[73] Assignee: Pioneer Electronic Corporation, Tokyo, Japan

[21] Appl. No.: 338,073

[22] Filed: Apr. 14, 1989

[30] Foreign Application Priority Data

Jun. 14, 1988 [JP] Japan ................. 63-144825

[51] Int. Cl.⁵ .............................. H03G 3/30
[52] U.S. Cl. .................... 330/279; 330/284; 307/264
[58] Field of Search ............... 330/129, 278, 279, 284, 330/307; 307/264, 471, 540

[56] References Cited

U.S. PATENT DOCUMENTS 4,647,790 3/1987 Voorman ..................... 307/264
4,815,118 3/1989 Acharya et al. ............. 330/284 X Primary Examiner—Steven Mottola
Attorney, Agent, or Firm—Sughrue, Mion, Zinn, Macpeak & Seas

[57] ABSTRACT

An adjusting apparatus for adjusting sound volume or sound quality of a signal reproduced from a music source in which an electronic volume section has a group of analog switches. The apparatus includes a signal generating means which generates a signal for switching the group of analog switches at the approximately zero-cross point of the reproduced signal of the music source.

6 Claims, 4 Drawing Sheets $Av_2 = \dfrac{R_{11}+R_{13}}{R_{13}}$ $Av_1 = \dfrac{R_{13}}{R_{12}+R_{13}}$

ADJUSTING APPARATUS FOR ADJUSTING SOUND VOLUME OR SOUND QUALITY

BACKGROUND OF THE INVENTION

1. Field of the Invention

The present invention relates to a sound volume or sound quality adjusting apparatus, and in particular, to an adjusting apparatus for adjusting sound volume or sound quality with respect to a reproducing signal from a music source by an electronic volume section constructed with analog switches.

2. Brief Description of the Prior Art

The sound volume or sound quality adjusting apparatus of this type is applied to an audio system as shown in FIG. 5. In this figure, a reproducing signal reproduced by music source 1 is supplied to electronic volume section 2 in which the volume or quality of a sound are adjusted, and thereafter is supplied to power amplifier 3. Power amplifier 3 amplifies the reproducing signal having the adjusted sound volume or sound quality, and produces the sound through speaker 4. Electronic volume section 2 is controlled by data signal DT, clock signal CK and strobe signal ST from control section 5 constructed with microcomputers.

FIG. 6 shows an example of the construction of electronic volume section 2 for adjusting the sound volume. In this figure, shift register 21 has an equal number of bits as the number of bits of data required to set the sound volume of electronic volume section 2. The number of bits of latch circuit 22 corresponds to a distance for a minimum damping amount of the electronic volume section 2, such as 81 steps when amounts 0 to $-80$ dB are damped every $-1$ dB. Reference numeral 23 is a group of analog switches disposed so that one switch corresponds to one of the bits of latch circuit 22, and reference numeral 24 is a resistance array composed of resistors connected in series to each other to provide the minimum damping amount, and connected to the respective analog switches of analog switch group 23.

In the apparatus constructed above, data signal DT, for setting the operating state of the electronic volume section 2 to a timing of the clock signal CK to achieve synchronization, is serially supplied from control section 5 to electronic volume section 2 and is stored in the shift register 21. Thereafter, strobe signal ST is supplied from control section 5 to electronic volume section 2 and data which was stored in the shift register 21 according to the timing of strobe signal ST, are provided to latch circuit 22. Latch circuit 22 determines the turning-on and turning-off states of the respective analog switches of analog switch group 23 according to the data thus provided.

The respective analog switches of analog switch group 23 are connected to the respective resistors connected in series to each other in resistance array 24 which inputs reproducing signal SIG IN at one end thereof and is connected to ground GND at the other end thereof. Accordingly, a signal at a voltage level based on data signal DT from control section 5 is selected and outputted from signal output SIG OUT through the analog switch group 23. Thus, the reproducing signal which is adjusted in voltage level is outputted from music source 1 from electronic volume section 2 and is then amplified by power amplifier 3, thereafter producing the sound from speaker 4.

FIG. 8 shows an example of construction of electronic volume section 2 for adjusting the sound quality.

In FIG. 8, elements indicated by the numeral 21 to 24 have the same function as shown in FIG. 6. And, the specific explanation are omitted.

In FIG. 8, the reproducing signal SIG IN is applied to a non inverting input terminal of an operational amplifier OP1 through a resistor $R_{12}$ and to an end of a resistance array 24. An inverting input terminal of the operational amplifier OP1 is connected to the other end of the resistance array 24 and to an output terminal of the operational amplifier OP1 through a feedback resistor $R_{11}$. Analog switches of analog switch group 23 are connected to a parallel resonance circuit (impedance circuit Z) consisting of a capacitor C and an inductance L, and to a resistor $R_{13}$ in series. The other end of the resistor $R_{13}$ is connected to ground GND. In the sound quality adjusting apparatus using the above described electronic volume section 2, when the most significant switch of the analog switch group 23, that is the closest to the non-inverting input terminal of the operational amplifier OP1, turns on, the impedance circuit Z and resistance $R_{13}$ are connected between the non-inverting terminal of the operational amplifier Op1 and ground GND in series. The reproducing signal SIG IN is amplified by a gain $A_{v1}$ and outputted to the output terminal of the operational amplifier OP1 as an output signal SIG OUT. The gain $A_{v1}$ is expressed by the following equation.

$$A_{v1} = \frac{(R_{13} + Z)}{R_{12} + (R_{13} + Z)}$$

Where the value of the impedance Z is able to be considered to zero when the input signal has the resonance frequency $f_0 = \frac{1}{2}\pi\sqrt{LC}$ calculated by capacitance C and inductance L. And, the value of impedance Z increase at the outer range of the resonance frequency $f_0$. Accordingly, the sound quality adjusting apparatus obtains an attenuation characteristic in which the resonance frequency $f_0$ is centered as shown in FIG. 9.

When the least significant switch of the analog switch group 23, that is the closest to the inverting input terminal of the operational amplifier OP1, turns on, the impedance circuit Z and resistance $R_{13}$ are connected between the inverting terminal of the operational amplifier OP1 and the earth GND in series. The producing signal SIG IN is amplified by a gain $A_{v2}$ and outputted to the output terminal of the operational amplifier OP1 as SIG OUT. The gain $A_{v2}$ is expressed by the following equation.

$$A_{v2} = \frac{R_{11} + (R_{13} + Z)}{R_{13} + Z}$$

In this case, the sound quality adjusting apparatus obtain a boost characteristic in which the resonance frequency $f_0$ is centered as shown in FIG. 9.

In the conventional sound volume or sound quality adjusting apparatus mentioned above, the respective analog switches of analog switch group 23 of electronic volume section 2 are switched according to the timing of strobe signal ST outputted from control section 5 so that the switches are operated randomly irrespective of the operating state of music source 1. Further, since the analog switches are normally constructed with C-MOS to be instantly operable, a discontinuous point is generated with respect to the output signals before and after the switching operation of analog switch group 23 as shown in FIG. 7. Therefore, when the sound is produced from speaker 4, the discontinuous portion sounds like a noise.

Discontinuous level $E_{ou}$ of a signal generated by the operation of electronic volume section 2 can be provided by the following formula when the output levels before and after this switching operation are respectively $E_{01}$ and $E_{02}$.

$$E_{ou} = |E_{01} - E_{02}| \quad (1)$$

For example, when a sine wave is reproduced, $$E_{01} = A \sin \omega t \quad (2)$$

$$E_{02} = B \sin \omega t \quad (3)$$

and discontinuous level $E_{ou}$ is provided by the following formula $$\begin{aligned} E_{ou} &= |A \sin \omega t - B \sin \omega t| \\ &= |A - B| \sin \omega t. \end{aligned} \quad (4)$$

When $\omega t = 90°$, $$E_{ou\ max} = |A - B| \quad (5)$$

is outputted as a change in level as a result of discontinuation.

SUMMARY OF THE INVENTION

Accordingly, an object of the present invention is to provide a sound volume or sound quality adjusting apparatus in which no discontinuous point is generated at the switching time of the electronic volume section.

To attain the above-mentioned object, a sound volume or sound quality adjusting apparatus for adjusting sound volume or sound quality of a reproducing signal from a music source is provided with an electronic volume section including a group of analog switches. The apparatus includes a signal generating device which generates a signal for switching the analog switch group, constituting the electronic volume section, at an approximately zero-cross point of the reproducing signal of the music source.

The signal generating device includes zero-cross generating means which detects the approximately zero-cross point of the reproducing signal of said music sources. The signal generating device also includes two-stabilizing means which is set by a signal generated at the switching time of the analog switch group, and logic product means which perform a logic product between a detection signal generated when the approximately zero-cross point is detected by the zero-cross generating device and a signal outputted when the two-stabilizing means is set. The logic product means generates a signal for switching said analog switch group so that the set state of the two-stabilizing means is reset by the signal generated by the logic product means.

BRIEF DESCRIPTION OF THE DRAWINGS

The invention will be more clearly understood from the following description in conjunction with the accompanying drawings, wherein.

DETAILED DESCRIPTION OF THE PREFERRED EMBODIMENT

In the apparatus constructed above, since the signal for switching the analog switch group is generated at the approximately zero-cross point of the reproducing signal of the music source, the difference in output level before and after the switching operation can become substantially zero so that no discontinuous portion, which appears as audio, is generated.

With respect to the signal for switching the above analog switch group, the zero-cross generating means detects the approximately zero-cross point of the reproducing signal of the music source, and the two-stabilizing means (i.e., bistable means is set by the signal generated when the analog switch group of the electronic volume section is appropriately switched. The logic product means generates the signal for switching the analog switch group according to the logic product between the signal generated by the detection of the zero-cross point and the signal outputted in the set state of the two-stabilizing means. The two-stabilizing means is reset by the signal generated by the logic product means, thereby subsequently generating a signal for switching the analog switch group of the electronic volume section.

The embodiments of a sound volume or sound quality adjusting apparatus of the present invention will now be described with reference to the drawings.

Figure 1:
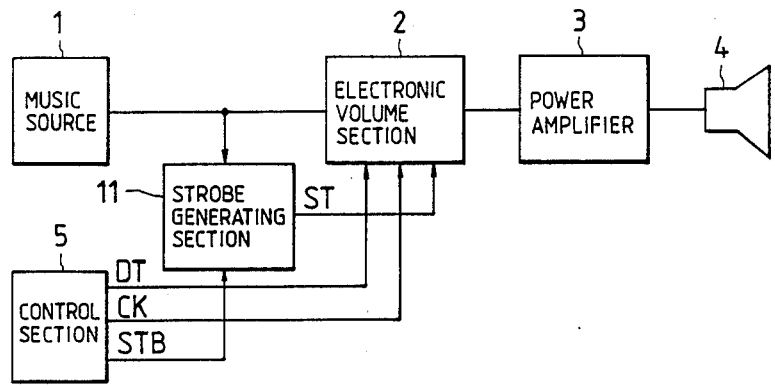
FIG. 1 is a block diagram showing an audio system to which a sound volume or sound quality adjusting apparatus in accordance with the present invention is applied.

FIG. 1 is a block diagram showing an audio system to which the sound volume or sound quality adjusting apparatus of the present invention is applied. In this figure, the same portions as those in the above-mentioned conventional apparatus shown in FIG. 5 are designated by the same reference numerals and therefore the description thereof is omitted in the following description.

Figure 5:
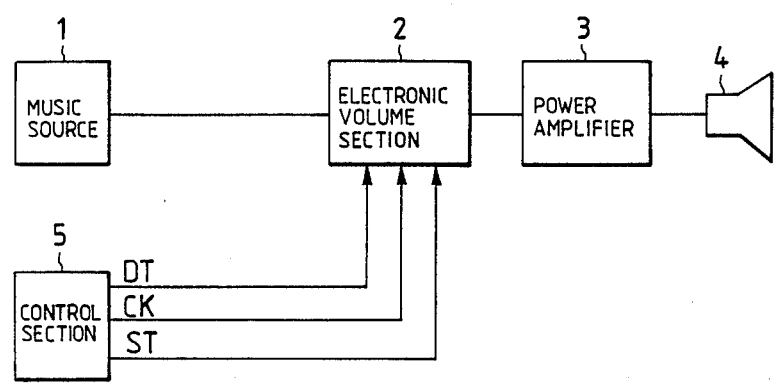
FIG. 5 is a block diagram showing an audio system to which a conventional sound volume or sound quality adjusting apparatus is applied.
Figure 6:
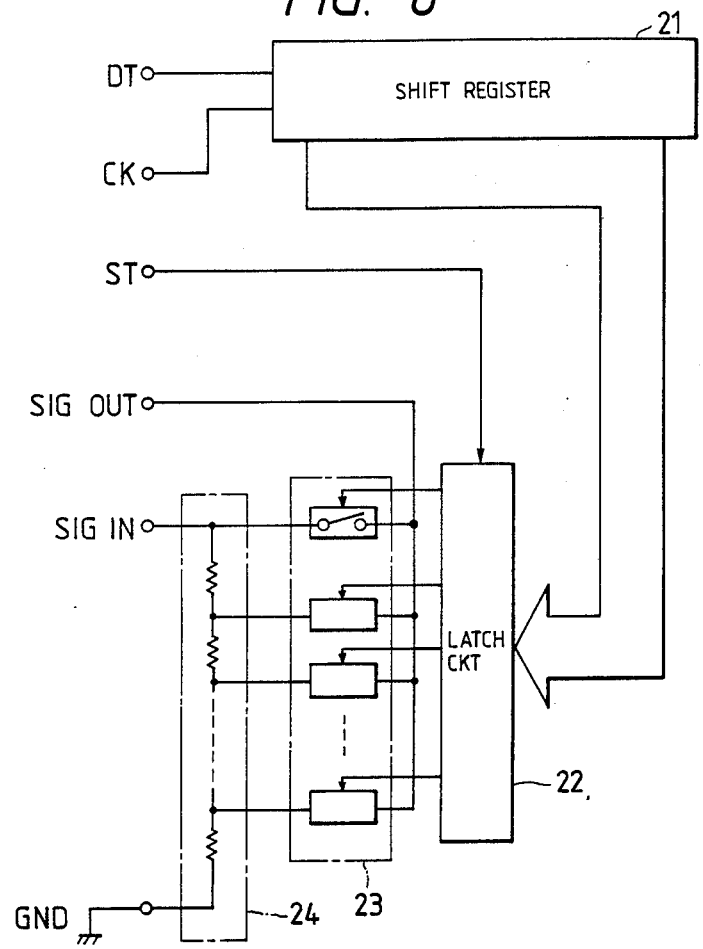
FIG. 6 is a block diagram showing an example of electronic volume section for adjusting sound volume.
Figure 7:
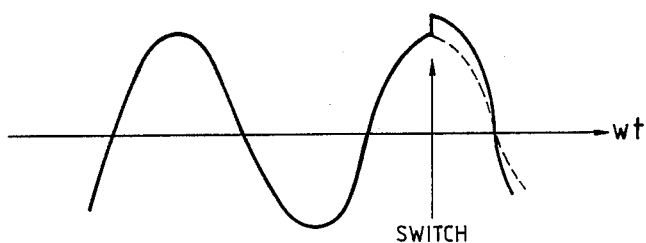
FIG. 7 is a view of an output waveform of a signal provided at the switching time in the conventional apparatus.
Figure 8:
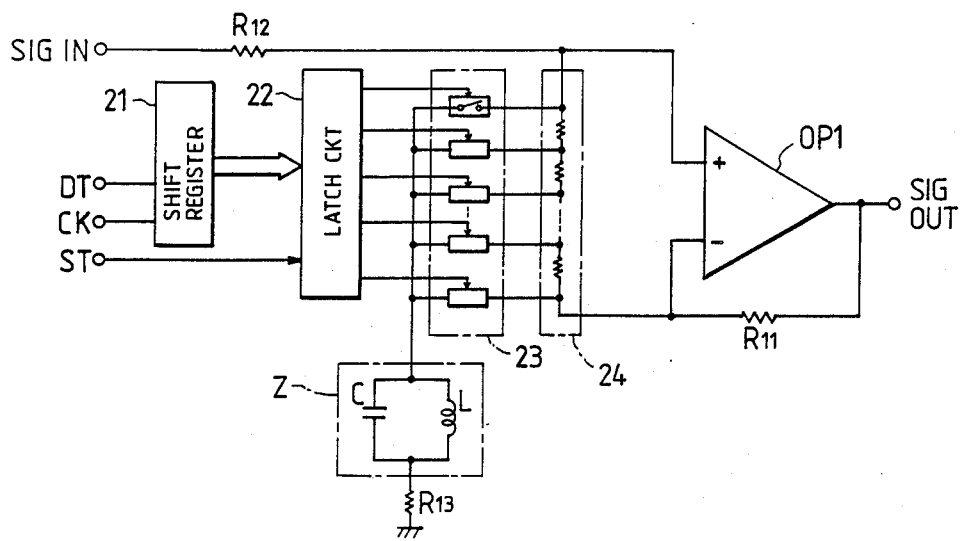
FIG. 8 is a block diagram showing an example of electronic volume section for adjusting sound quality.
Figure 9:
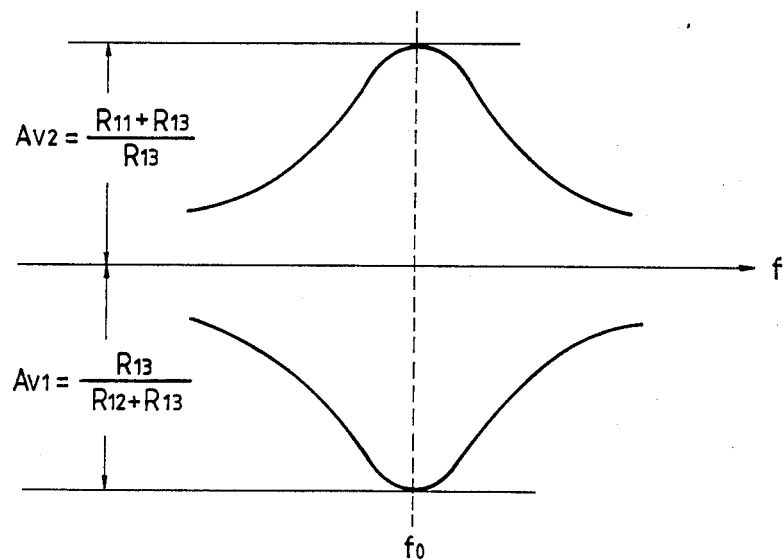
FIG. 9 is a view showing a frequency characteristic of the electronic volume section as shown in FIG. 8.

In FIG. 1, strobe generating section 11 receives a reproducing signal from music source 1 and standby signal STB from control section 5 (which is the same signal as strobe signal ST with respect to conditions such as timing, etc., in the conventional apparatus of FIG. 5). Strobe generating section 11 generates strobe signal ST at a zero-cross point of the reproducing signal.

Figure 2:
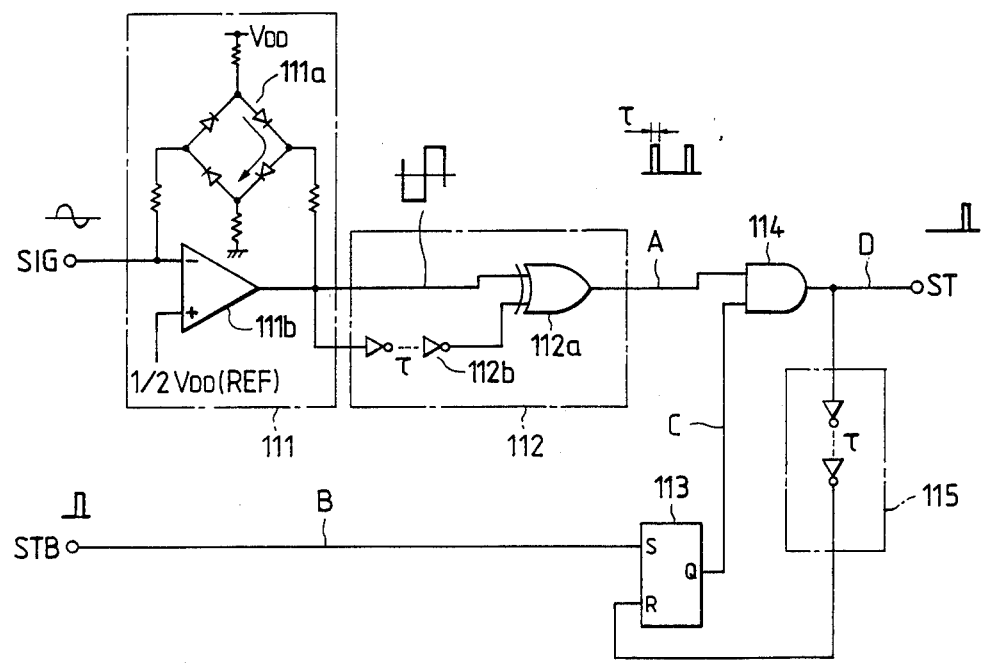
FIG. 2 is a circuit diagram showing a concrete example of circuits in a main portion of the sound volume or sound quality adjusting apparatus in accordance with the present invention.

FIG. 2 is a circuit diagram showing a concrete construction of strobe generating section 11. In this figure, strobe generating section 11 has waveform amplifying section 111, zero-cross generating section 112, state setting R/S flip flop (R/S - FF) 113, and section 114 for generating the strobe signal.

Waveform amplifying section 111 is composed of diode bridge 111a and operational amplifier 111b constituting a comparator. The reproducing signal from music source 1 which is shifted by $\frac{1}{2} V_{DD}$ is inputted an inverted input terminal of the operational amplifier 111b and is compared with reference voltage $\frac{1}{2} V_{DD}$ applied to a non-inverted input of this operational amplifier. By the voltage characteristics of diodes of diode bridge 111a, 0 V (GND) is outputted to an output of waveform amplifier 111 when the reproducing signal from music source 1 has a higher voltage than the reference voltage, and a DC level signal having voltage $V_{DD}$ is outputted as the output of waveform amplifier 111 when the reproducing signal from music source 1 is lower in voltage than the reference voltage.

Figure 3:
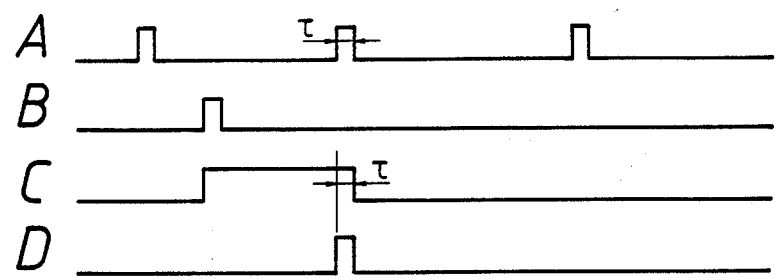
FIG. 3 is a timing chart showing operating states of respective circuit portions of FIG. 2.

Zero-cross generating section 112 includes a two-input EX-OR circuit 112a. The output of waveform amplifier 111 is directly inputted to one input of two-input EX-OR circuit 112a, and an output provided by delaying the output of waveform amplifier 111 is inputted to the other input of two-input EX-OR circuit 112a. To provide such a function, a plurality of inverters 112b are connected in series to the other input of EX OR circuit 112a so as to delay the output of the waveform amplifier by $\tau$ seconds relying on the fact that the transmitting timings of inverters 112b are delayed. EX-OR 112a outputs a pulse as shown by A in FIG. 3 which has a voltage of H level during $\tau$ seconds at the zero-cross time, as a result of the undelayed and delayed outputs of waveform amplifier 111. When standby signal STB from control section 5, as shown by B in FIG. 3, is inputted to set input S of RS-FF section 113, output Q of RS-FF section 113 attains a voltage of H level as shown by C in FIG. 3. Accordingly, when analog switch group 23 of electronic volume section 2 is operated to change a set value of the electronic volume section 2, control section 5 causes standby signal STB to rise to H level in voltage.

The strobe generating section 114 includes a two-input AND circuit. One input of this two-input AND circuit is connected to the output of EX-OR circuit 112a and the other input thereof is connected to output Q of RS-FF section 113. When both inputs of two-input AND circuit 114 attain H level in voltage, an output of this AND circuit attains H level in voltage as shown by D of FIG. 3, thereby generating strobe signal ST.

Strobe signal ST outputted from the output of AND circuit 114 is delayed by $\tau$ second by delay circuit 115 constituted by a plurality of inverters connected in series to each other and is then inputted to reset input R of RS-FF section 113 so that output Q falls to original L level in voltage.

In accordance with the above-mentioned apparatus, strobe signal ST for controlling the operation of analog switch group 23 of electronic volume section 2 can be generated at the zero-cross point of the reproducing signal from music source 1, so that analog switch group 23 is operated at the zero-cross point of the reproducing signal.

Namely, since discontinuous level $E_{ou}$ represented by $$E_{ou} = |A - B| \sin \omega t \tag{4}$$

has zero-cross point $\omega = 0°$ or $180°$, $$\begin{aligned} E_{ou} &= |A - B| \sin 0° \\ &= |A - B| \times 0 = 0 \end{aligned} \tag{5}$$

so that no discontinuous point is generated.

In the above-mentioned embodiment, zero-cross generating section 112 generates a signal at the zero-cross point of the reproducing signal from music source 1, however, the results of the present invention can be sufficiently obtained even when this signal is not exactly generated at the zero-cross point, but is generated at a point in the vicinity of the zero-cross point, since the discontinuous portion of this signal can be made small.

Figure 4:
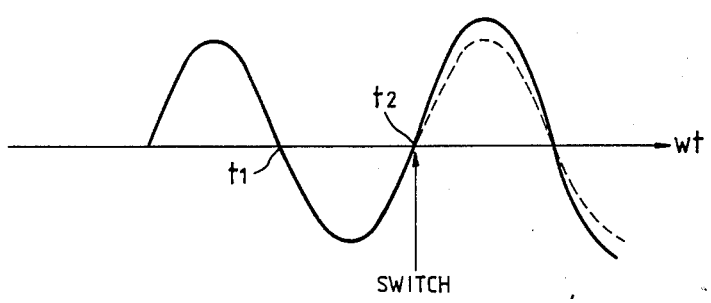
FIG. 4 is a view showing an output waveform of a signal provided at the switching time in the apparatus of the present invention.

FIG. 4 is view showing an output signal waveform provided by the above-mentioned switching operation. In this figure, when standby signal STB is generated for a time interval from time point $t_1$ to time point $t_2$, the switching operation of the analog switch group of the electronic volume section is really performed at time point $t_2$ so that no discontinuous portion is generated with respect to the signal.

As mentioned above, in accordance with the present invention, since the analog switched at the approximately zero-cross point of the reproducing signal of the music source, the discontinuous portion, occurring between a point before the switching operation of the analog switch group and after the switching operation can be reduced as small as possible and no audible noise resulting from the discontinuous portion are generated.

What is claimed is:

1. An adjusting apparatus for adjusting at least one of sound volume and sound quality, having an electronic volume section comprising a group of analog switches responsive to a control signal for adjusting said at least one of sound volume and sound quality with respect to a reproducing signal of a music source, said apparatus avoiding distortion in said reproducing signal due to switching of an adjustment of said electronic volume section and further comprising:

signal generating means for generating said control signal, said signal generating means including:

zero-cross generating means for providing a detection signal upon detection of an approximately zero-cross point of the reproducing signal of said music source;

control means for generating a standby signal which allows said signal generating means to operate said electronic volume section; and logical means for generating a logical product between said zero-cross detection signal and said standby signal to generate said control signal.

2. An adjusting apparatus for adjusting at least one of sound volume and sound quality, having an electronic volume section comprising a group of analog switches responsive to a control signal for adjusting said at least one of sound volume and sound quality with respect to a reproducing signal of a music source, said apparatus further comprising:

a signal generating means for generating said control signal at an approximately zero-cross point of the reproducing signal of the music source, wherein said generating means comprises:

zero-cross generating means for providing a detection signal upon detection of the approximately zero-cross point of the reproducing signal of said music source;

bistable means set by a signal generated at the switching time of the analog switch group of said electric volume section; and logical product means for generating a logical product between said detection signal and a signal outputted when said bistable means is set, said logical product means generating said control signal;

whereby the set state of said bistable means is reset by the signal generated by the logical product means.

3. An adjusting apparatus as claimed in claim 2, wherein said signal generating means further comprises:

waveform amplifying means which outputs a reference voltage when said reproducing signal of said music source is lower than a predetermined voltage, and outputs zero volts when said reproducing signal of said music source is greater than said predetermined voltage.

4. An adjusting apparatus as claimed in claimed 3, wherein said waveform amplifying means comprises:

a diode bridge and an operational amplifier.

5. An adjusting apparatus as claimed in claim 3, wherein said zero-cross generating means comprises:

an exclusive OR gate which directly receives an output of said waveform amplifying means at a first input, and receives a delayed output of said waveform amplifying means at a second input.

6. An adjusting apparatus as claimed in claim 5, wherein said bistable means comprises an RS flip flop; and said logical product means comprises a two-input AND gate, said AND gate receiving the output of said exclusive OR gate and said RS flip flop.

* * * * *